(12) United States Patent
Schuh

(10) Patent No.: US 9,985,629 B2
(45) Date of Patent: May 29, 2018

(54) METHOD TO LOCKOUT A TOUCH SCREEN INTERFACE

(71) Applicant: Whirlpool Corporation, Benton Harbor, MI (US)

(72) Inventor: Eric J. Schuh, Stevensville, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 952 days.

(21) Appl. No.: 13/958,896

(22) Filed: Aug. 5, 2013

(65) Prior Publication Data

US 2015/0035786 A1 Feb. 5, 2015

(51) Int. Cl.
  *G06F 3/044* (2006.01)
  *H03K 17/96* (2006.01)
  *G06F 3/041* (2006.01)

(52) U.S. Cl.
  CPC ....... *H03K 17/9622* (2013.01); *G06F 3/0416* (2013.01); *H03K 2217/960705* (2013.01)

(58) Field of Classification Search
  None
  See application file for complete search history.

(56) References Cited

U.S. PATENT DOCUMENTS

| | | | |
|---|---|---|---|
| 5,526,422 A | 6/1996 | Keen | |
| 7,614,008 B2 | 11/2009 | Ording | |
| 7,847,789 B2 | 12/2010 | Kolmykov-Zotov et al. | |
| 2009/0021401 A1* | 1/2009 | Williams | G06F 3/023 341/24 |
| 2010/0207894 A1* | 8/2010 | Tsuei | 345/173 |
| 2010/0265200 A1* | 10/2010 | Cho et al. | 345/173 |
| 2011/0167375 A1* | 7/2011 | Kocienda | 715/773 |
| 2011/0181516 A1 | 7/2011 | Mallory et al. | |
| 2012/0110747 A1* | 5/2012 | Yum et al. | 8/137 |
| 2013/0069903 A1* | 3/2013 | Geiger et al. | 345/174 |
| 2014/0009418 A1* | 1/2014 | Sugimoto | 345/173 |
| 2015/0009160 A1* | 1/2015 | Cho | G06F 3/0416 345/173 |

FOREIGN PATENT DOCUMENTS

KR 1020070040165 A 4/2007

* cited by examiner

*Primary Examiner* — Kent Chang
*Assistant Examiner* — Benjamin Morales Fernande

(57) ABSTRACT

A method for locking out a portion of a touch screen interface in response to an inadvertent touch comprises steps to detect multiple touches on the portion of the touch screen interface; determine that the multiple touches are incompatible; initiate a lockout time period in response to the determination and reinitiate the lockout time period in response to a subsequent touch during the lockout time period.

13 Claims, 3 Drawing Sheets

METHOD TO LOCKOUT A TOUCH SCREEN INTERFACE

BACKGROUND OF THE INVENTION

Increasingly, appliances provide a touch screen interface for user input and control. Leaning or brushing against the touch screen interface of an appliance may initiate an undesirable or unwanted effect such as turning the appliance off during a cycle of operation.

SUMMARY OF THE INVENTION

The invention relates to a method for locking out a portion of a touch screen interface in response to an inadvertent touch. The method comprises steps to detect multiple touches on the portion of the touch screen interface; determine that the multiple touches are incompatible; initiate a lockout time period in response to the determination and reinitiate the lockout time period in response to a subsequent touch during the lockout time period.

DESCRIPTION OF EMBODIMENTS OF THE INVENTION

A method for locking out a portion of a touch screen interface is described. As noted above, touch screen interfaces and their capacitive touch controls are prone to activation by a user through inadvertent contact. Particularly, in home appliance such as clothes washing machines and dishwashers, users of the appliance may lean or brush against the capacitive touch controls while in the normal course of using the appliance.

Figure 1:
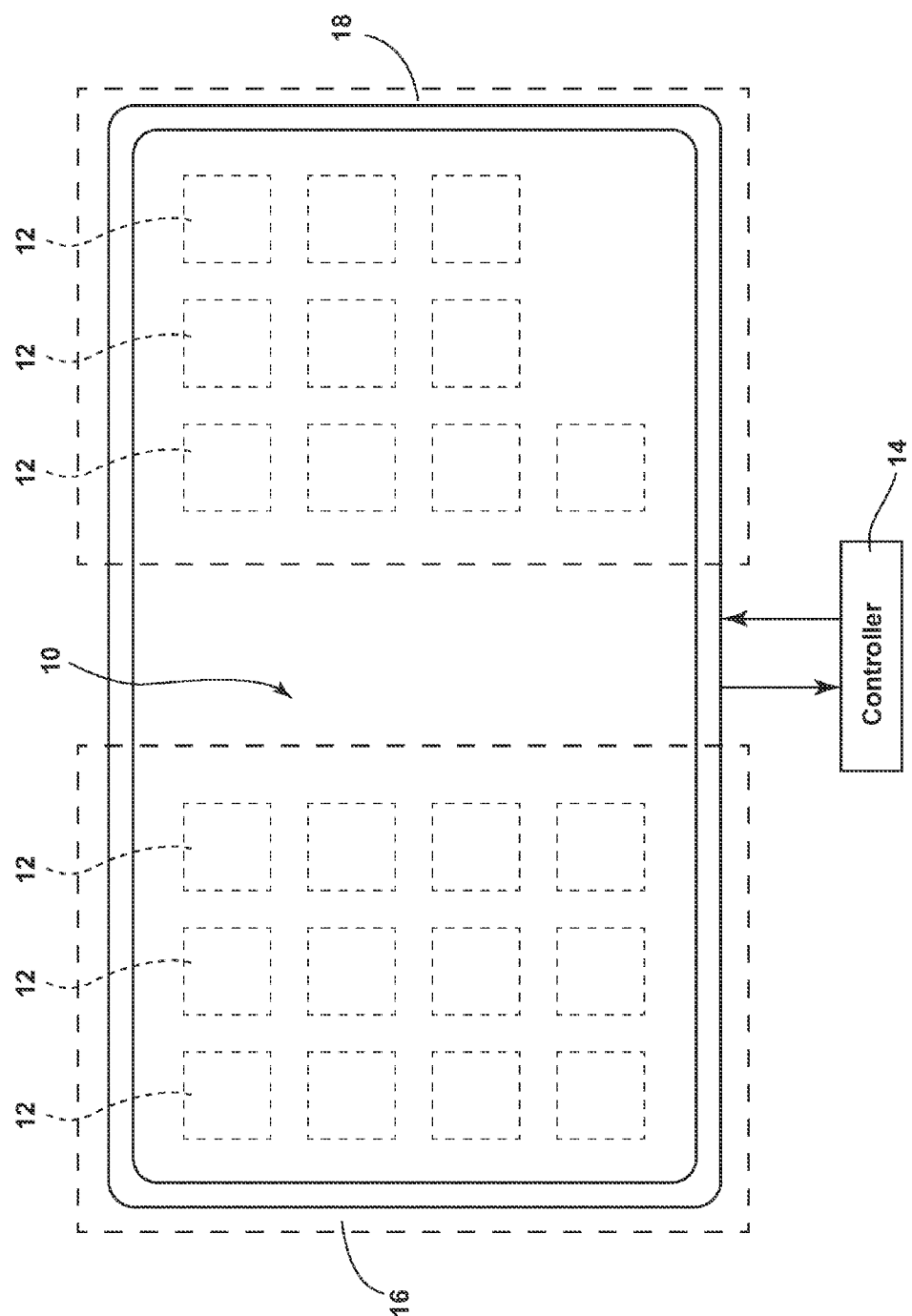
FIG. 1 is a schematic view of a touch screen interface.

FIG. 1 illustrates a schematic view of a touch screen interface in which locking out portions of the interface can be implemented. The touch screen interface typically includes a touch screen panel 10 integrated into an electronic device such as an appliance. A plurality of touch keys 12 may be implemented in the touch screen panel 10 that are in electrical communication with a controller 14 embedded in the electronic device. Contact with the touch keys 12 may send a signal to the controller 14 to process the touch screen input as a user selection and initiate an action such as a cycle of operation for an appliance.

A touch screen panel 10 may sense touch by one of a variety of different methods. Classified by the measured phenomenology indicative of a touch, types of touch screen panels include capacitive, resistive, surface acoustic wave, and infrared. In the case of a capacitive touch screen panel, touching the surface of the touch screen results in a measurable distortion of the screen's electrostatic field, measurable as a change in capacitance.

Figure 2:
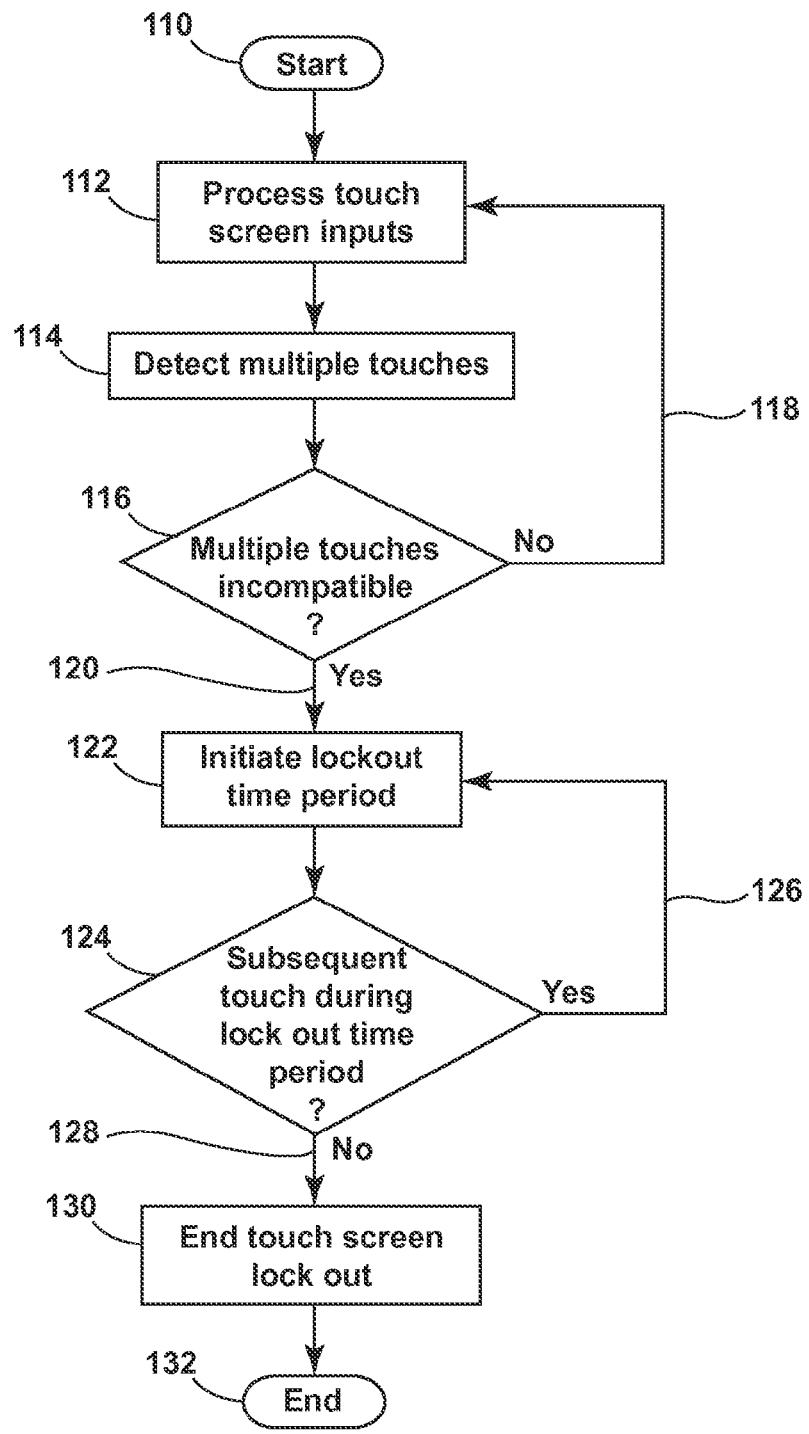
FIG. 2 is a flowchart illustrating a method to lockout a touch screen interface according to an embodiment of the invention.

The touch screen panel 10 may include touch keys 12 to provide a user an interface for initiating a device action. A capacitive touch key 12 may act as a capacitive switch or button for selecting an action or toggling a state of operation of the electronic device. For the touch screen panel 10 shown in FIG. 1, the touch keys 12 are shown as an array of buttons grouped into two zones 16, 18. Touch keys 12 may be grouped into one or more zones based on characteristics that may include functionality, ergonomics or aesthetics. While two zones 16, 18 each with a matrix of touch keys 12 are shown in FIG. 2, other arrangements of touch keys are contemplated and are typically arranged based upon the system design requirements. The system design requirements may include limitations imposed by the deployed touch screen technology, the desired aesthetics of the graphic user interface and the form factor of the touch screen panel.

The capacitive touch keys 12 may be disposed on the touch screen panel 10 in a discrete and static arrangement of electrodes. That is, each capacitive touch key 12 may be a single touch sensor, often called a touch switch, including one or more electrodes capable of outputting a signal indicative of a touch event but not a touch location. While the location of a capacitive touch switch may remain static, the function of the control may be flexibly programmable to invoke any number of functions on the electronic device.

Alternatively, the touch screen panel 10 may have a virtual arrangement of capacitive touch keys. In other words, the touch screen panel 10 may include an array of interconnected electrode elements capable of outputting a signal indicative of both a touch event and touch location. In contrast to an array of capacitive touch switches, virtual touch controls may be dynamically sized and placed on a touch screen panel during operation of the touch screen interface.

An electronic device with a touch screen interface may include a touch screen panel 10 where some set of the touch keys 12 are discrete capacitive touch switches and another set of the touch keys 12 are virtual touch controls. The arrangement of the touch switches and the virtual touch controls may be completely integrated such that the user is presented with the impression of a single monolithic interface. Conversely, a more heterogeneous arrangement is contemplated where the touch switches are placed in proximity to the virtual touch controls, but the controls do not appear visually integrated. In this way, certain functions of the electronic device such as powering the device on or off or activating a cycle of operation may be activated by touching a touch switch and state-dependent functions may be accessible by a virtual touch control.

Regardless of the particular implementation of the touch keys 12, a controller 14 in communication with the touch screen panel 10 and its associated touch keys 12 may process the touch screen inputs, initiate an action to be taken by the electronic device and provide a response to the touch screen panel 10. The feedback response may include a visual, audible or haptic acknowledgement of the user selection and an update of the touch screen interface based on the current state of the electronic device.

While processing the touch screen inputs, the controller 14 may include procedures for detecting inadvertent touches and locking out at least a portion of the touch screen as shown in the flowchart in FIG. 2. Initially, at block 100, a user may activate a device with a touch screen interface either purposefully or inadvertently. When the touch screen interface includes a plurality of discrete touch keys 12, a purposeful contact by the user may consist, for example, of contact with a single touch key 12. Conversely, an inadvertent touch may include the user contacting multiple touch keys 12.

In response to the user's contact with one or more of the touch keys 12, the controller 14 provided on the device may process the touch screen inputs at block 112. When the controller 14 detects a single touch; that is, activation of a single touch key 12, the controller 14 may, as described above, process the single touch input, initiate an action and provide a response.

Upon processing the touch screen inputs, the controller 14 may detect multiple touches at block 114. To detect multiple touches, the controller 14 may process inputs of touches of multiple touch keys 12. By analysis of the concurrency of the touches, the controller 14 may determine if the inputs are indicative of a multiple touch event or a series of purposeful commands issued by the user of the touch interface. To determine that the touches are concurrent, the controller 14 may determine that the multiple touches are simultaneous or have occurred within a predetermined time. For example, the controller 14 may determine that multiple touches have been detected if two or more touch controls are activated within 100 milliseconds (ms) of one another. Other predetermined durations of time are contemplated. For example, multiple touches may be considered a concurrent multiple touch event if the controller 14 determines they occurred within 500 ms of one another. The predetermined duration of time may be shorter than 100 ms and may be any duration that substantially indicates the simultaneous occurrence of multiple touches.

Upon the detection of multiple touches, the controller 14 may determine at block 116 if the multiple touches are incompatible. Incompatible touches are multiple touches of a touch screen interface that are not indicative of a user-selectable combination. In other words, various combinations of touch keys 12 of a touch screen interface, when touched simultaneously, may not activate a predetermined response of the electronic device. In contrast, when the controller 14 detects multiple touches of touch keys 12 that are compatible, the controller 14 may process the compatible touch inputs 118 at block 112 to initiate a response.

The number of touches the controller 14 determines to be concurrent may determine the incompatibility of the multiple touches. If the number of multiple touches exceeds a threshold, the controller 14 may determine the touches to be incompatible. For example, a controller 14 may detect multiple touches and determine them to be incompatible if more than one touch key 12 is concurrently activated. However, the controller 14 may be configured to allow for any number of multiple touches. For example, the controller 14 may allow two concurrent touches for a touch screen interface. The combination of the two coordinated multiple touches may indicate a specific function of the electronic device. Similarly, the controller 14 may allow three or more concurrent touches depending upon the implementation.

The controller 14 may determine the incompatibility of the multiple touches based upon a current operation of the electronic device or state of the touch screen interface. Touch screen interfaces are often dynamically configured such that the controls are more intuitive for the user. For example, touch screen interfaces are often designed in layers, only revealing functions to the user when they are relevant. In this way, the display content of the touch screen interface, including the touch keys 12, may adapt to the current operation of the device. Therefore, depending upon the state of the interface, the controller 14 may determine that a specific set of multiple touches are incompatible for one state of the interface and compatible for another state of the interface. When the electronic device is an appliance, the cycle of operation of the appliance may determine the state of the touch screen interface and its current mode of operation.

In response to the determination of the incompatible touch inputs 120, the controller 14 may initiate a lockout time period at block 122. During the lockout time period, a portion of the touch screen interface including some or all of the touch keys 12 may be non-responsive to user interaction with the touch screen interface. The nonresponsive portion of the touch screen interface may include all of the capacitive touch controls in one or more zones 16, 18 of the touch screen interface. The lockout time period may be set to a predetermined duration of time. The duration of time may preferably be based on the length of time it takes a typical user to purposefully activate the touch keys 12 in a series. In this way, additional inadvertent activation of the touch keys 12 may be mitigated. For example, the lockout time period may be set to 100 ms though other predetermined durations of time are contemplated.

At block 124, the controller 14 may determine whether a subsequent touch occurs during the lockout time period. Regardless of whether the touch is purposeful or inadvertent, if a touch occurs during the lockout time period 126, the controller 14 may reinitiate the lockout time period at block 122. Initiating a lockout time period at block 122 followed by detection of a subsequent touch during the duration of the time period 126 may occur multiple consecutive times. Accordingly, the controller 14 may reset the lockout time period one or more times for an additional lockout time period upon detection of an additional touch occurring during the current lockout time period. In this way, the portion of the touch screen interface currently locked out may remain nonresponsive to input until no touches are detected for the lockout time period.

If the controller 14 does not detect any subsequent touches during the lockout time period 128, then the controller may end the touch screen lockout at block 130. Upon expiration of the touch screen lockout, at block 132, the controller 14 may end the current instance of locking out a portion of the interface. The controller may then start the process anew at block 110 and process subsequent touch screen inputs at block 112.

For a touch screen interface that includes multiple zones 16, 18, the controller 14 may implement the lockout procedure described above independently for each zone 16, 18. In this way, the controller 14 may detect multiple touches only for the portion of the touch screen interface that includes the touch keys 12 located in the first zone 16. Likewise, the controller 14 may separately distinguish multiple touches for the portion of the touch screen interface that includes the touch keys 12 located in the second zone 18. Additionally, the lockout time period and subsequent non-responsiveness to user interaction may apply to each zone independently. In this way, each zone 16, 18 may have a lockout time period. The first zone 16 may have a lockout time period that is different than the second time period. For example, the first zone 16 may have an associated lockout time period of 100 ms while the second zone 18 may have an associated lockout time period of 1 s. Any number of additional zones may be added where the controller 14 processes the lockout procedure and lockout time period independently for each zone.

Figure 3:
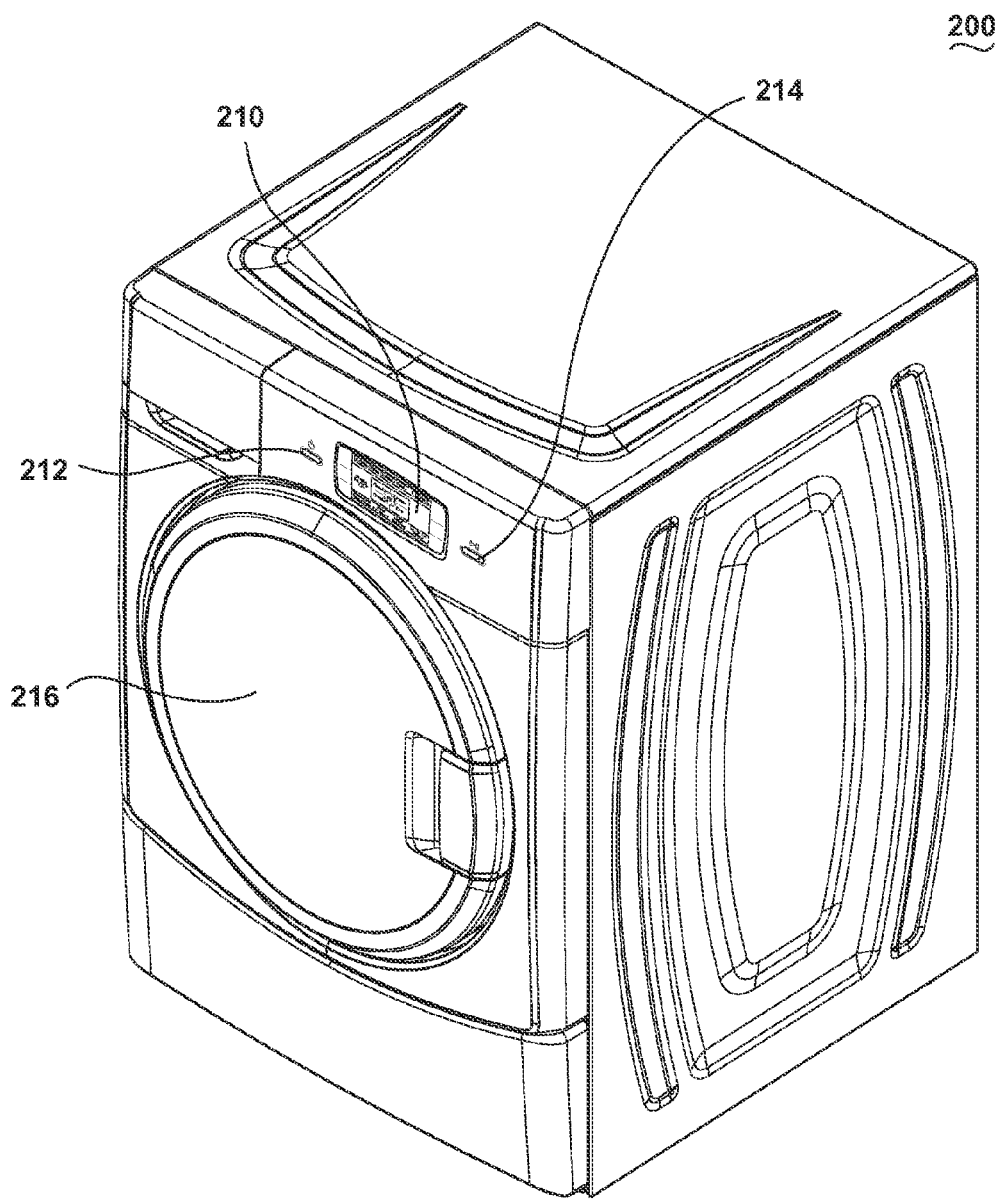
FIG. 3 is a clothes washing machine in which embodiments of the method to lockout a touch screen interface can be implemented.

FIG. 3 illustrates a clothes washing machine 200 in which embodiments of the method to lockout a touch screen interface can be implemented. For example, a touch screen interface for a clothes washing machine 200 may include a touch screen 210 that includes a set of reconfigurable touch keys as well as discrete touch keys 212, 214 in proximity to the touch screen. The discrete touch keys 212, 214 may indicate functions such as powering on and off the appliance as well as initiating or canceling a cycle of operation. The touch screen 210 may indicate other functions for selecting or modifying a cycle of operation such as selecting the water temperature or laundry load type. A user may inadvertently contact any of the touch keys by leaning against the elements of the touch screen interface. By implementing the method described above, accidental powering off of the washing machine or canceling a wash cycle may be avoided. It is additionally contemplated that elements of a touch screen interface may be implemented on other areas of the washing machine more likely to incur accidental activation through incidental contact with a user including the appliance door 216.

Embodiments of the disclosed methods may be implemented in hardware, firmware, software, or any combination thereof. Embodiments of the disclosed methods implemented in a home appliance such as a clothes washing machine may include one or more point-to-point interconnects between components and/or one or more bus-based interconnects between components. Embodiments of the disclosed methods may also be implemented as instructions stored on a tangible, machine-readable medium, which may be read and executed by one or more processors. A tangible, machine-readable medium may include any mechanism for storing or transmitting information in a form readable by a machine (e.g., a processor). For example, a tangible, machine-readable medium may include read only memory (ROM), random access memory (RAM), magnetic disk storage, optical storage, flash memory, and/or other types of memory devices.

Technical effects of the method disclosed in the embodiments include preventing premature cessation of a cycle of operation of an appliance if a user inadvertently leans against the touch screen controls. The method may also prevent other accidental and potentially undesirable actions that may include powering the appliance off during a cycle of operation.

While the invention has been specifically described in connection with certain specific embodiments thereof, it is to be understood that this is by way of illustration and not of limitation. Reasonable variation and modification are possible within the scope of the forgoing disclosure and drawings without departing from the spirit of the invention which is defined in the appended claims.

What is claimed is:

1. A method for locking out at least a portion of a touch screen interface in response to an inadvertent touch, the method comprises:
    detect multiple touches on the portion of the touch screen interface;
    determine that the multiple touches are incompatible touches, wherein the incompatible touches include touches that are not indicative of a user-selectable combination;
    initiate a lockout time period in response to the determination; and
    reinitiate the lockout time period in response to a subsequent touch during the lockout time period.

2. The method of claim 1 wherein the multiple touches occur within a predetermined time.

3. The method of claim 2 wherein the multiple touches are simultaneous.

4. The method of claim 1 wherein the incompatibility of the multiple touches is determined by the number of touches.

5. The method of claim 4 wherein the number of touches exceeds a threshold.

6. The method of claim 1 wherein the incompatibility of the multiple touches is determined by a current operation.

7. The method of claim 6 where the current operation is a cycle of operation for an appliance.

8. The method of claim 1 wherein the subsequent touch comprises any touch.

9. The method of claim 1 wherein the subsequent touch comprises any incompatible touch.

10. The method of claim 1 wherein the detecting multiple touches on the portion of the touch screen interface comprises detecting multiple touches in a first zone of touch keys on the touch screen interface.

11. The method of claim 10 wherein the detecting multiple touches on the portion of the touch screen interface further comprises detecting multiple touches in a second zone of touch keys on the touch screen interface.

12. The method of claim 11 wherein the first zone has a first lockout time period and the second zone has a second lockout time period.

13. The method of claim 12 wherein the first lockout time period is different than the second lockout time period.

\* \* \* \* \*